United States Patent [19]

Degani et al.

[11] Patent Number: 6,074,897

[45] Date of Patent: Jun. 13, 2000

[54] INTEGRATED CIRCUIT BONDING METHOD AND APPARATUS

[75] Inventors: Yinon Degani, Highland Park, N.J.; Lawrence Arnold Greenberg, Allentown, Pa.

[73] Assignee: Lucent Technologies Inc., Murray Hill, N.J.

[21] Appl. No.: 09/238,706

[22] Filed: Jan. 28, 1999

Related U.S. Application Data

[62] Division of application No. 08/641,585, May 1, 1996.

[51] Int. Cl.[7] .......................... H01L 21/44; H01L 21/48; H01L 21/50; H01L 23/48; H01L 23/52; H01L 29/40

[52] U.S. Cl. .......................... 438/115; 438/108; 438/906; 257/778; 134/1.3

[58] Field of Search .................................. 438/108, 115, 438/127, 906; 257/778, 793; 134/1.3

[56] References Cited

U.S. PATENT DOCUMENTS

| | | | |
|---|---|---|---|
| 4,320,047 | 3/1982 | Murphy | 523/457 |
| 5,211,764 | 5/1993 | Degani | 148/25 |
| 5,385,290 | 1/1995 | Degani | 228/180.22 |
| 5,477,611 | 12/1995 | Sweis | 29/840 |
| 5,534,078 | 7/1996 | Breunsbach | 134/10 |
| 5,656,862 | 8/1997 | Papathomas | 257/778 |
| 5,710,071 | 1/1998 | Beddingfield | 438/108 |
| 5,794,330 | 8/1998 | Distefano | 29/840 |
| 5,855,821 | 1/1999 | Chau | 252/514 |

OTHER PUBLICATIONS

R. R. Tummula, et al., *Microelectronics Packaging Handbook* pp. 366–391 (Van Nostrand Reinhold, New York, NY, 1989).

*Primary Examiner*—Charles Bowers
*Assistant Examiner*—Nema Berezny

[57] ABSTRACT

A technique for enabling sufficient flow of flux cleaning fluids and an underfill material in the relatively low-profile gap between a flip-chip bonded IC chip and a substrate, such as a printed circuit board, is to provide at least one aperture in the substrate under the IC chip. The use of such an aperture enables, for example, flux cleaning fluid to flow through the aperture into the low-profile gap between the IC chip and the substrate surface, such as by the application of pressure or by gravity, which then exits through openings between formed interconnect bonds at a sufficient flow rate to adequately remove flux residues. An epoxy underfill to the IC chip can be formed in a similar manner. For example, a relatively thick bead of epoxy, such as on the order of the thickness of the IC chip, is deposited or stencil printed on the substrate surface around the edges of the IC chip and capillary action is then relied upon to draw the epoxy into the low-profile gap. Undesirable air pockets which otherwise would develop form the displaced air as the epoxy flows into the low-profile gap can advantageously escape through the aperture of the invention.

11 Claims, 4 Drawing Sheets

INTEGRATED CIRCUIT BONDING METHOD AND APPARATUS

This is a divisional of application Ser. No. 08/641,585, filed on May 1, 1996.

FIELD OF THE INVENTION

The invention relates to bonding of integrated circuits to substrates.

BACKGROUND OF THE INVENTION

New bonding techniques have provided high-density interconnections within and between integrated circuits and in other applications within electronic equipment. These techniques include the assembling of multichip modules which may contain several unpackaged integrated circuit (IC) chips mounted on a single substrate. One technique for assembling unpackaged IC chips in a multichip module or other circuit assemblies is flip-chip bonding.

Flip-chip bonding is achieved by providing an IC chip with a perimeter or area array of solder wettable contact pads which are the signal input/output terminals, and a matting array of solder wettable contact pads on a substrate. Prior to assembly on the substrate, either the chip, the substrate or both typically under a processing step wherein a solder bump is deposited at each contact pad of the IC chip and/or substrate. The IC chip is then oriented in an aligned manner on the substrate such that the solder bumps align with the corresponding wettable pads, or such that solder bumps on the IC chip and the substrate align with each other. Interconnect bonds are then made simultaneously by heating the solder bumps to a reflow temperature at which the solder flows and an electrically conductive joint is formed. Such a process is described in R. R. Tummula and E. J. Rymaszewski, *Microelectronics Packaging Handbook*, pp. 366–391 (Van Nostrand Reinhold, New York, N.Y., 1989), which is incorporated by reference herein.

Typically, the IC chip in the resulting structure is not flush against the substrate, but raised above the substrate based on the height of the formed interconnect bonds, which is typically on the order of 50 $\mu$m to 100 $\mu$m. Accordingly, a corresponding lowprofile gap exists between the IC chip and the substrate. After the reflow process, flux residues can remain in this formed low-profile gap as well as between the formed interconnect bonds. If not removed, the flux residues have the potential to degrade electrical performance and hinder formation of an epoxy underfill as is described below. However, the corresponding low-profile openings formed between the edges of the IC chip and the substrate hinder the flow of flux cleaning fluid into this low-profile gap. As a result, removal of flux residues is presently difficult to achieve.

Moreover, bonding of an IC chip to a substrate having different coefficients of thermal expansion can be problematic because differences in thermal expansion of the chip and substrate at elevated temperatures can produce shear forces on the interconnect bonds causing them to break. Typically, a low-elasticity epoxy underfill is added in the low-profile gap between the IC chip and the substrate to reduce such shear forces. However, because of the corresponding low-profile edge openings to the gap, it has been likewise difficult to flow epoxy into the low-profile gap to form the underfill.

Conventional methods for forming the epoxy underfill are tedious and time consuming and are a bottleneck during large scale production of many component assemblies. Moreover, such methods often produce air pockets in the epoxy located in the low-profile gap that are formed from the air displaced as the epoxy is flowed into the gap. These air pockets tend to expand when the assembly is subjected to elevated temperatures producing a separation force between the IC chip and substrate which can break the interconnections.

One known method for forming the underfill which reduces the likelihood for air pockets is to successively deposit beads of epoxy using a syringe around the edge of one or two non-parallel sides of the IC chip and allow capillary action to draw the epoxy under the chip. The structure is usually heated during this stage to 70° to 100° C. to reduce the viscosity of the underfill material and facilitate the capillary flow. After this gap is completely filled, a finishing border of epoxy having a height equal to that of the IC chip, typically on the order of 0.38 mm to 0.76 mm, is deposited around the chip's perimeter. The assembly is often heated to a temperature between 70° C. and 90° C. to lower the epoxy's viscosity and reduce the underfill formation time. However, even with such heating, each epoxy bead application typically requires approximately two minutes for IC chips having dimensions on the order of 1.5 cm by 1.5 cm. Moreover, such IC chips often require as much as six of the epoxy bead applications or approximately twelve minutes to completely fill the gap between the chip and the substrate. Such formation times are unsuitable for the large scale commercial production of component assemblies.

Thus, a need exists for an enhanced bonding technique that enables relatively fast and efficient methods for removing flux residues as well as for forming underfills.

Summary of the Invention

A novel and unobvious technique for enabling sufficient quantities of flux cleaning fluids and underfill material to flow into the open, relatively low-profile gap between a bonded IC chip and a substrate, such as a printed circuit board, is to provide at least one aperture in the substrate under the IC chip. The use of such an aperture enables, for example, flux cleaning fluid to flow through the aperture into the gap between the IC chip and the substrate, such as under pressure or by gravity, and exit through openings between the formed interconnect bonds at a sufficient flow rate to adequately remove flux residues. In an alternative arrangement, the cleaning fluid flows into the low-profile gap at a sufficient rate through the openings between the formed interconnect bonds and exits through the aperture. Such cleaning methods are relatively quick, inexpensive and provide sufficient exposure of surfaces in the gap to cleaning fluid for adequate cleaning of the flux residues. The cleaning method of the invention is useful for low-profile gaps having a height up to 150 $\mu$m. Further, this cleaning method is very desirable for gap heights of 100 $\mu$m or less and even more desirable for gap heights of 50 $\mu$m or less.

The aperture also provides an escape for air pockets as a material, such as epoxy, is introduced into the gap between the IC chip and the substrate surface to create an underfill. In one embodiment, a relatively thick bead of epoxy, such as on the order of the thickness of the IC chip, is deposited on the substrate surface around the edges of the IC chip and capillary action is then relied upon to draw the epoxy into the low-profile gap. It is possible to deposit the epoxy at room temperature and then to heat the structure to facilitate the flow of the underfill material. It is further possible to advantageously perform this heating on a plurality of such structures simultaneously during an underfill curing process. In another embodiment that is suitable for the commercial production of a large number of component assemblies, the epoxy is stencil printed over and surrounding the IC chips and capillary action is again relied upon to draw the epoxy into the low-profile gap. As in the previously described embodiment, air displaced by the epoxy entering the low-profile gap escapes through the aperture.

Moreover, these methods can advantageously create the underfill and corresponding surrounding epoxy border in a single step. It is possible to employ a relative pressure difference in the environment above and below the substrate to either push or draw the epoxy into the low-profile gap in accordance with the invention. It is also possible for the epoxy to be pumped into the gap through the aperture.

The invention is particularly suitable for bonding applications wherein the formed low-profile gap has a height which hinders the flow of material into the gap. Exemplary gap heights of 300 $\mu$m or less typically have such effects on underfill material flow rates.

Accordingly, the aperture provided in the substrate beneath the IC chip in accordance with the bonding technique of the invention provides numerous advantages in overcoming the difficult problems associated with cleaning flux residues and/or forming an epoxy underfill encountered by conventional bonding techniques. The invention has an additional use of enabling coupling of a heat sink to the IC chip through the aperture for producing a low profile assembly.

Additional features and advantages of the present invention will become more readily apparent from the following detailed description and accompanying drawings.

DETAILED DESCRIPTION

The invention is based on the realization that, in integrated circuit (IC) chip bonding, the difficulties in enabling cleaning fluid and underfill material to flow into the formed low-profile gap between an unpackaged IC chip and a substrate, such as a conventional printed circuit board, can be overcome by providing at least one aperture in the substrate beneath the gap. As defined herein, "low-profile gap" refers to a formed gap between an IC chip and a substrate having a height that without the aperture of the invention would tend to hinder the flow of material through the gap. The aperture of the invention facilitates the use of low-cost, relatively rapid and efficient techniques for flowing the cleaning fluid and underfill material into the low-profile gap. In particular, the aperture provides an entry or exit for the cleaning fluid as well as a means for air pockets to escape during formation of an underfill.

The cleaning method of the invention is useful for low-profile gaps having a height up to 150 $\mu$m. Further, this cleaning method is very desirable for gap heights of 100 $\mu$m or less and even more desirable for gap heights of 50 $\mu$m or less. Moreover, the invention enables the advantageous flowing of underfill materials, such as epoxy, into low-profile gaps having heights of, for example, 300 $\mu$m or less, which would typically hinder the flow of such materials when an aperture is not used. However, the invention is also useful for low-profile gaps of greater heights to achieve like advantages.

The invention is described and depicted in the figures with respect to exemplary residue cleaning and epoxy underfill formation techniques. However, such embodiments are for illustration purposes only and are not meant to be a limitation of the invention. The substrate aperture of this invention also enables advantageous techniques for flowing various other cleaning fluids as well as forming other underfill materials or introducing any lower viscosity material in the low-profile gap at low-cost.

Figure 1:
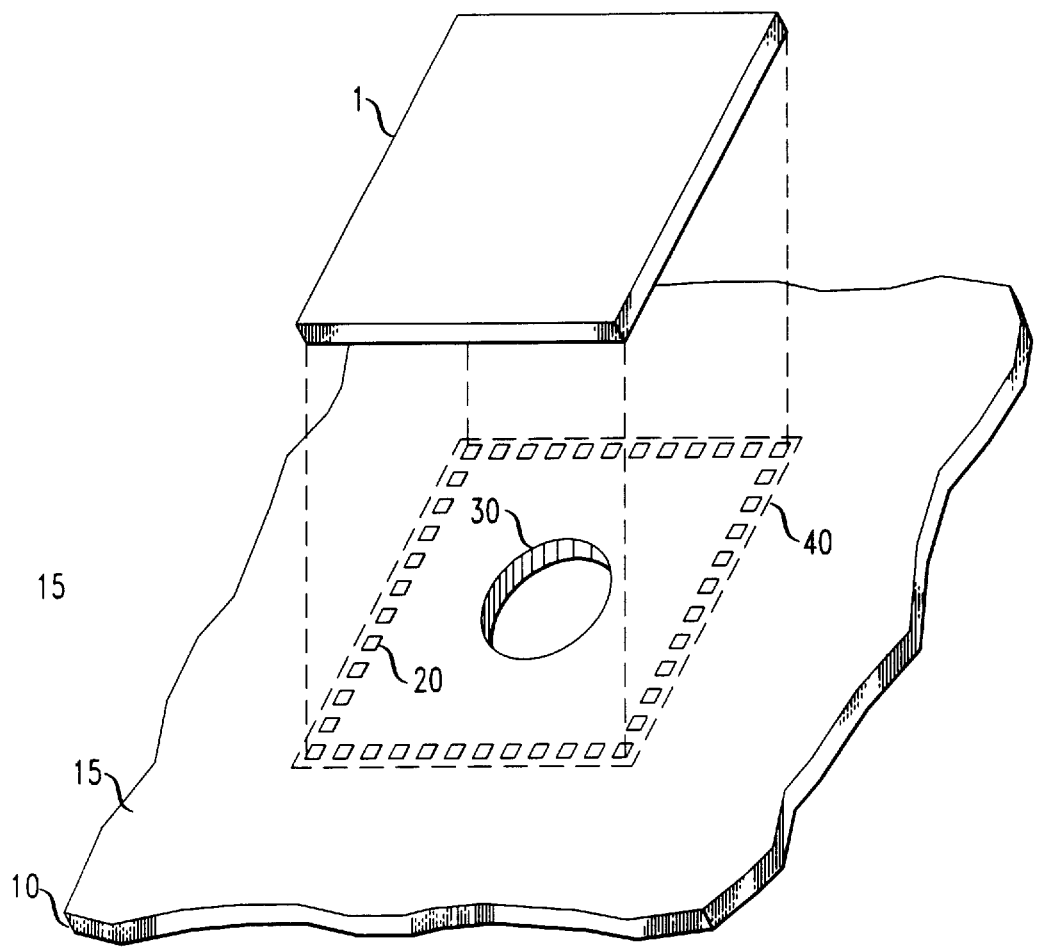
FIG. 1 illustrates a perspective view of an exemplary integrated circuit chip and Substrate arrangement in accordance with the invention prior to bonding.

FIG. 1 depicts an exemplary arrangement in accordance with the invention of an unpackaged IC chip 1 that is to be connected to a portion of an exemplary substrate 10 by a bonding technique, such as a flip-chip bonding technique. The particular material employed for the substrate 10 is not critical to practicing the invention and can include, for example, conventional fiberglass or reinforced epoxy resin circuit boards. In a similar manner, the particular type of IC chip I used with the invention is likewise not critical to and can include integrated circuits, such as those based on silicon or GaAs. Such chips can have dimensions, for example, in the range of approximately 0.4 cm×0.4 cm to 1.5 cm×1.5 cm, as well as a thickness in the range of 0.30 mm to 0.80 mm.

Figure 2:
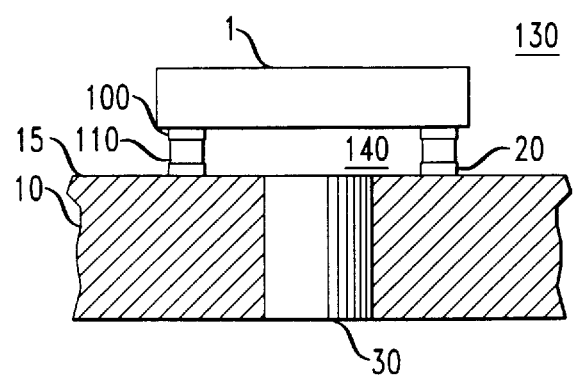
FIG. 2 illustrates a cross-sectional view of an exemplary component assembly comprising the integrated circuit chip and substrate of FIG. 1 bonded to one another.

Solder wettable contact pads 20 are disposed on a major surface 15 of the substrate 10 and match a mating perimeter array of solder wettable contact pads 100, shown in FIG. 2, formed on the IC chip 1. The contact pads 20 enable signal communication between the IC chip I and other electrical components connected to the substrate 10. In accordance with the invention, an aperture 30 is provided in the substrate 10 within a footprint area 40 where the IC chip 1 is to be mounted as shown in FIG. 1. A single aperture 30 has been shown for ease of illustration, however, multiple apertures can be used in the footprint area 40 in accordance with the invention.

The shape of the aperture 30 is not particularly critical for the invention and, in addition to the depicted circular shape, it can be, for example, triangular, rectangular, oval as well as other multiple-sided shapes. Limitations on the size of the aperture 30 is described below with regard to FIGS. 3A and 4A. Although a perimeter array of contact pads 20 and 100 are illustrated in FIGS. 1 and 2, it should be readily understood that an area array of contact pads can also be used on the IC chip 1 and substrate 10 in accordance with the invention. The aperture 30 should be sufficiently spaced from the contact pads 20 so as not to interfere with the formation of interconnect bonds between the IC chip 1 and the substrate 10.

In FIG. 2, interconnect bonds 110 between the contact pads 100 of the IC chip 1 and the mating contact pads 20 on the substrate 10 are formed to produce a component assembly 130. The interconnect bonds 110 on the far side of the IC chip 1 of the component assembly 130 in FIG. 2, looking into the drawing, have not been shown for ease of illustration. Also, in FIG. 2, the contact pads 20 and 100 are shown extending above the respective surfaces of the substrate 10 and IC chip 1 for clarity and it should be readily understood that such contact pads can also be flush or recessed with respect to such surfaces.

The particular bonding method employed to form the interconnect bonds 110 is not critical to practicing the invention and can include a conventional stencil printing of solder paste and reflow procedure. More specifically, solder joints can be formed in such a procedure by stencil printing solder paste on each contact pad 100 of the substrate 10. The IC chip 1 is then oriented in an aligned manner on the substrate 10 such that the printed solder paste aligns with the corresponding wettable pads 20. The solder joints or interconnection bonds 110 are then made by heating the solder bumps to a reflow temperature at which the solder flows and an electrically conductive joint is formed. Reflow processes, in general, are described in further detail in the previously cited *Microelectronics Packaging Handbook*. Additional flip-chip bonding techniques which can be used according to the invention include those described in U.S. Pat. Nos. 5,211,764 and 5,385,290, which are assigned to the assignee of the present invention and incorporated by reference herein.

Figure 3A:
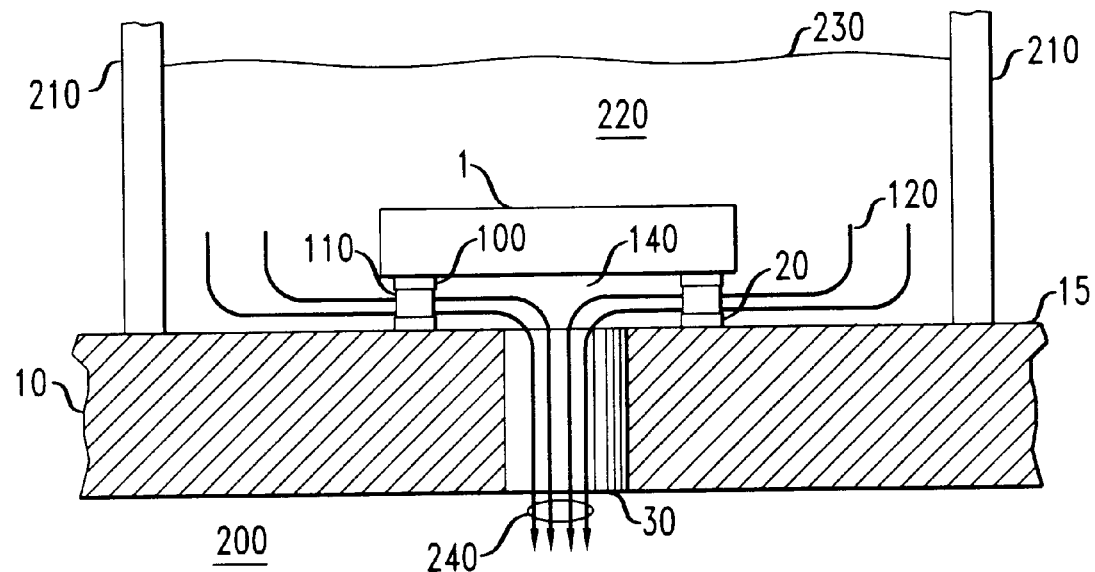
FIG. 3A and 3B illustrate representations of the assembly of FIG. 2 in respective exemplary arrangements for removal of flux residues from between the integrated circuit chip and the substrate in accordance with the invention.
Figure 3B:
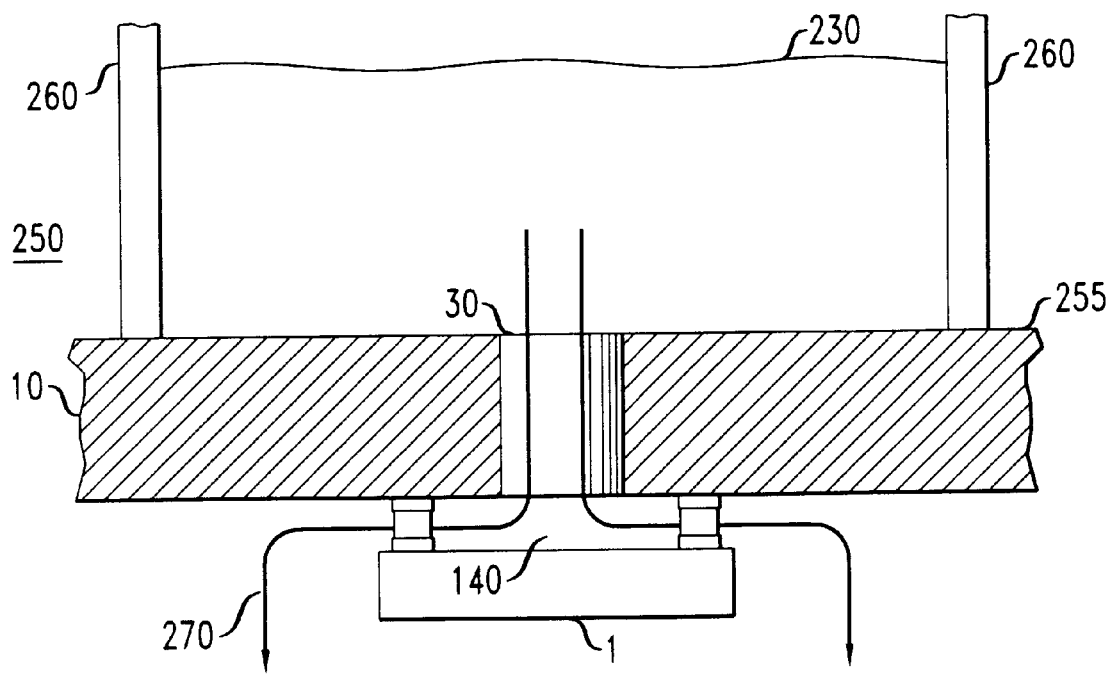

It is possible for the formed interconnections 110 to have a height in the approximate range of 25 μm to 300 μm. Likewise, a corresponding low-profile gap 140 is formed in the space between the IC chip and the substrate surface 15 having a corresponding height in the approximate range of 25 μm to 300 μm. The aperture 30 facilitates the use of low-cost and efficient techniques for providing flux cleaning fluid to this low-profile gap 140 as is depicted in FIGS. 3A and 3B. Also, the aperture 30 facilitates the use of low-cost, relatively rapid and efficient techniques for providing an underfill epoxy within the low-profile gap as is shown in FIGS. 4A and 4B, and 5A and 5B. The aperture 30 is particularly suitable for applications in which the gap 140 has a height of approximately 100 μm or less.

The component assembly 130 of FIG. 2 is shown in a flux residue cleaning arrangement 200 in FIG. 3A. In FIG. 3A, temporary containment walls 210 are provided on the substrate surface 15 surrounding the IC chip 1. The containment walls 210 and surface 15 form a cavity 220 over the IC chip 1. A sufficiently tight seal should be provided between the containment walls 210 and the surface 15 to enable a cleaning fluid 230 deposited in a cavity 220 to substantially drain or flow through the separations between the interconnect bonds 110 into the low-profile gap 140 and exit through the aperture 30 as indicated by flow lines 240. In this manner, flux residues and other undesirable material remaining in those gaps after reflow can be removed.

The particular flux cleaning fluid used is not critical to practicing the invention and should be dependent upon the flux employed during the soldering process. For instance, if water-cleanable flux is used, such as AMTECH WS 485, then the corresponding cleaning fluids can be water or water-based. It is also possible to employ turpentine-based or related cleaning fluids if rosin-based flux, such as AMTECH NC 557, is used in the formation of the interconnect bonds 110.

The size of the aperture 30 should be large enough to enable an adequate flow rate for the cleaning fluid 230 through the separations between the interconnections 110 and gap 140 to remove the flux residues. Exemplary aperture sizes can be in the approximate range of 1% to 20% of the IC chip foot print area 40, shown in FIG. 1, if gravity is relied upon to provide such a flow rate. However, it is alternatively possible to employ a smaller aperture 30 if the fluid 230 is forced through such gaps by creating an elevated pressure environment above the fluid, such as, for example, by the use of a conventional plunger, or by producing a low pressure environment beneath the aperture 30. Although the containment walls 210 are depicted surrounding a single integrated circuit chip, i.e., the IC chip 1, it should be readily understood that a substrate area containing multiple integrated circuit chips having apertures disposed beneath them can be cleaned simultaneously according to the invention by providing such walls around the multiple chips as a group.

An alternative cleaning arrangement 250 to that of FIG. 3A is shown in FIG. 3B, wherein a cavity is formed by containment walls 260 and a substrate major surface 255 opposite to the surface 15. In this configuration, fluid can be forced by gravity or under pressure through the aperture 30, into the gap 140 and out through the separation between the interconnect bonds 110 as shown by flow lines 270. An advantage of this arrangement 250 is that it substantially reduces the likelihood that flux residues or other undesirable material within a perimeter area of the IC chip 1 would become wedged in the low profile gap 140 during the cleaning process.

Figure 4A:
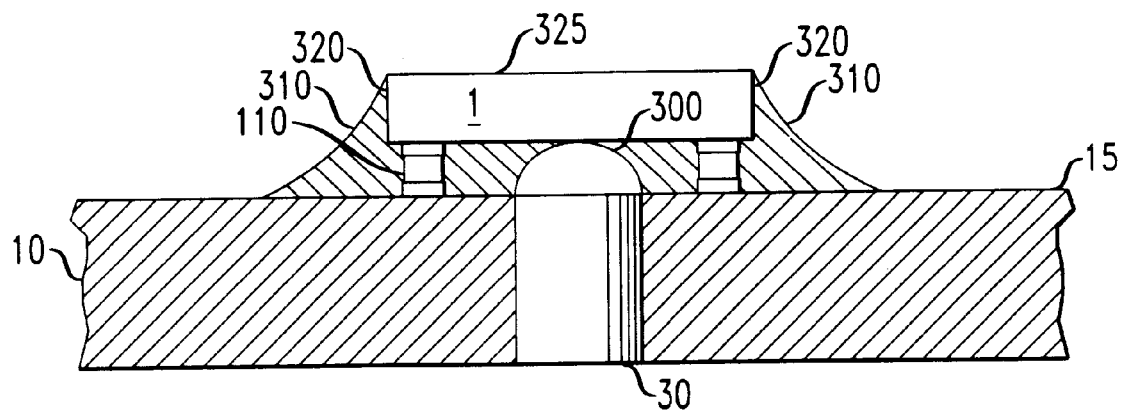
FIG. 4A and 4B, and 5A and 5B illustrate representations of the assembly of FIG. 2 in respective exemplary arrangements for forming an underfill between the integrated circuit chip and the substrate in accordance with the invention.

After removal of the flux residues and undesirable materials, it is often advantageous to form a low-elasticity material underfill 300, such as an epoxy, in the low-profile gap 140 as shown in FIG. 4A. It is desirable for the underfill 300 to include a border 310 in an area surrounding the interconnects 110. The border 310 should extend from the substrate surface 15 to a level above the interconnect bonds 110 to further reduce shear forces that otherwise could cause at least one of the interconnect bonds 110 to break. Greater reductions in shear forces could be provided by employing larger borders 310 extending to higher locations on IC chip sides 320. However, it is alternatively possible to produce an underfill 300 without a surrounding border in accordance with the invention albeit providing lesser protection to the interconnect bonds 110 against shear forces.

Figure 4B:
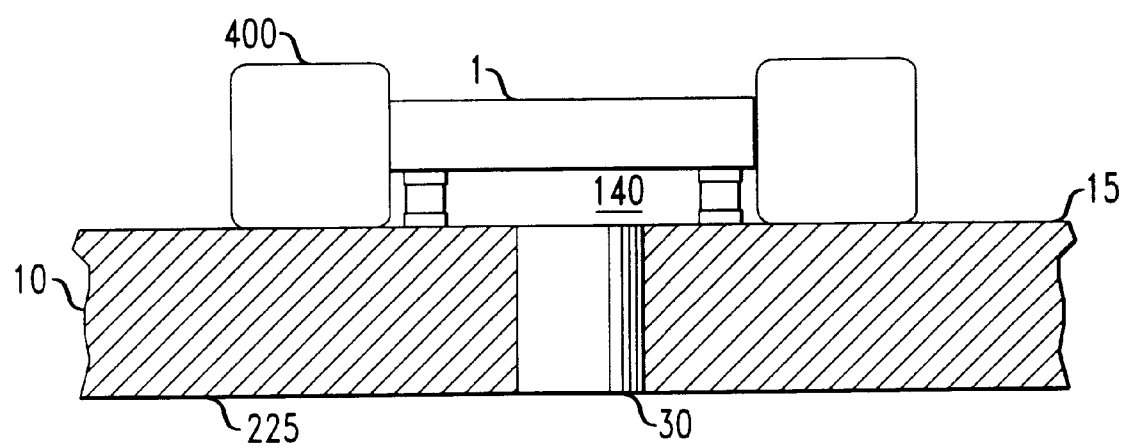

An exemplary arrangement for forming the epoxy underfill 300 for the component arrangement of FIG. 4A is shown in FIG. 4B. In FIG. 4B, a bead 400 of epoxy is formed on the substrate surface 15 around a perimeter of the IC chip 1. An exemplary method for forming the bead 400 is by dispensing or by stencil printing. Then, capillary action is relied upon to draw the epoxy 300 into the low-profile gap 140 to produce the completed component assembly shown in FIG. 4A. After the low-profile gap 140 is filled with epoxy, the epoxy is cured by, for example, exposure to elevated temperatures or ultra-violet light, to produce a cross-linked low-elasticity underfill.

Undesirable air pockets that tend to form the in the low-profile gap in conventional systems because air displaced by the epoxy as it is drawn into the gap has no means of escape, can now escape through the aperture 30 of the invention. Accordingly, the aperture 30 should be of a sufficient size to enable such air pockets to escape. In this manner, the invention substantially reduces the likelihood of the air pockets forming in the underfill 300, shown in FIG. 4A. It is possible for the resulting epoxy underfill to extend into the aperture 30 without any corresponding deleterious effects to the assembly.

The particular low-elasticity material employed should be selected so as to reduce shear forces that would be experienced by the interconnect bonds as a result of, for example, different thermal expansion rates of the substrate 10 and the IC chip 1, and is otherwise not critical to practicing the invention. A suitable exemplary low-elasticity epoxy is a Hysol-type epoxy manufactured by the Dextor Corporation, Olean, N.Y.

The quantity of material used for the bead 400 should enable the formation of the underfill 300 in the low-profile gap 140 as well as the desired border 310. For instance, an epoxy bead 400 having a thickness on the order of the thickness of the IC chip 1, such as, for example, in the range of 0.30 mm to 0.80 mm, can be used for forming the underfill 300 with the border 310 for an IC chip 1 having dimensions in the approximate range of 0.4 cm×0.4 cm to 1.5 cm×1.5 cm and a low-profile gap having a height in the approximate range of 50 $\mu$m to 150 $\mu$m. The formed border in such a component assembly would substantially extend to locations on the IC chip 1 sides 320 proximate the top surface 325.

It is possible for the capillary action that draws the epoxy 400 into the low profile gap 140 to occur substantially at room temperature. However, a reduction in time for forming the underfill 300 can be achieved by subjecting the assembly to elevated temperatures to lower the epoxy's viscosity and increase its possible to reduce the overall component assembly formation time by combining the underfill formation step with a curing step of the formation of the assembly 130 shown in FIG. 4A.

An exemplary curing process includes subjecting a soldered flip-chip assembly to an elevated temperature for a period of time to enable the curing of the epoxy disposed beneath an IC chip to produce a cross-linked low-elasticity underfill. By depositing the bead 400 prior to the heat curing step, the heat curing lowers the viscosity of the epoxy to enable it to more quickly flow into the low-profile gap. Once the gap 140 is filled with the epoxy, the assembly is heated to a particular temperature for a particular time to achieve the desired cross-linking of the underfill epoxy. An exemplary combined heat curing and underfill formation process includes subjecting the assembly to a temperature in the approximate range of 140° C. to 160° C. for a period of time in the approximate range of 0.2 to 3.0 hours. The previously described curing process is for illustration purposes only and is not meant to be a limitation on the invention. Other curing processes can be used with the invention including, for example, curing by exposure to ultra-violet light.

Figure 5A:
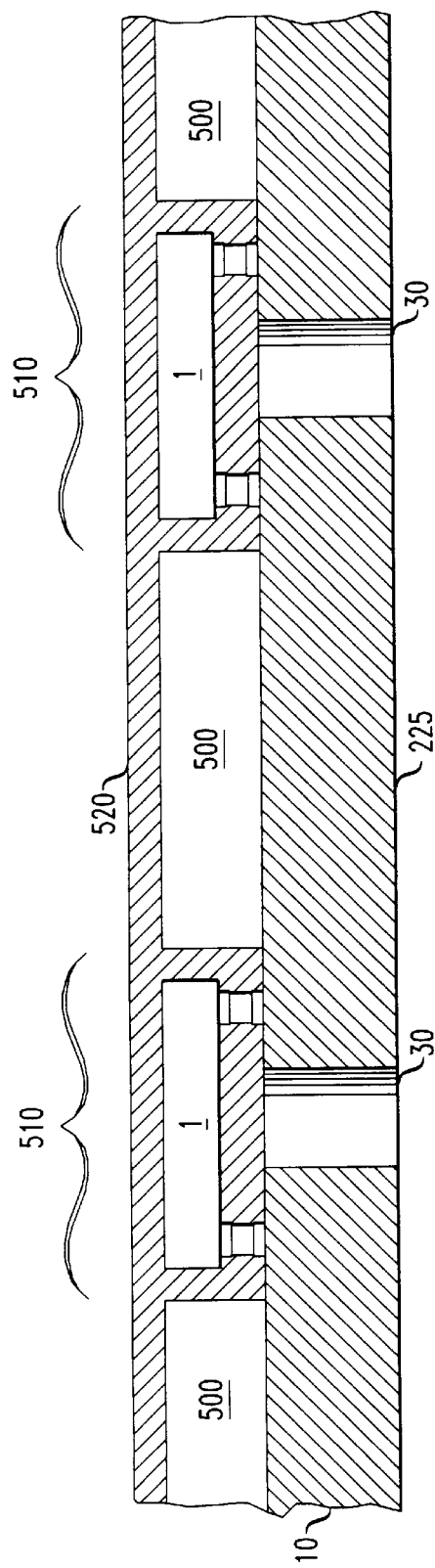
Figure 5B:
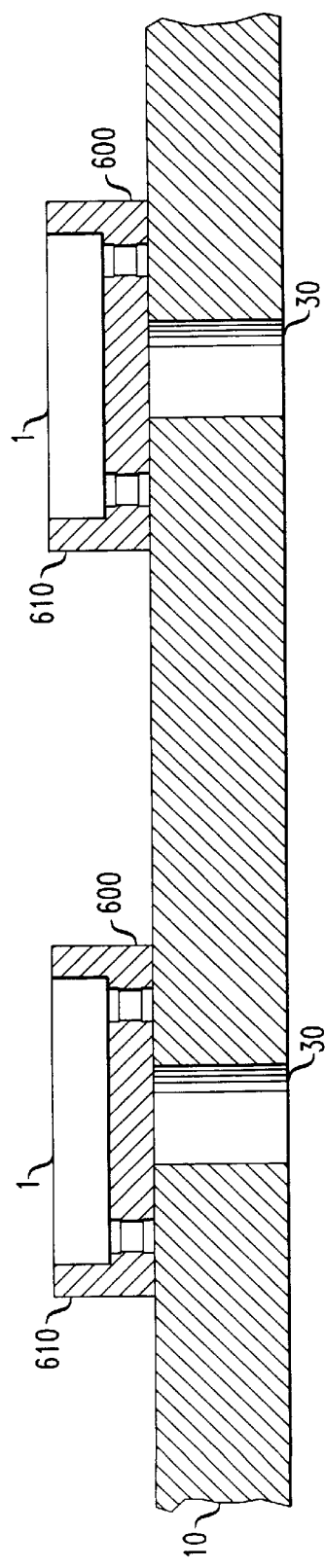

An alternative exemplary arrangement for forming an epoxy underfill is depicted in FIGS. 5A and 5B employs stencil printing the epoxy. This embodiment is particularly useful in the commercial production of component assemblies. In FIG. 5A, a stencil 500 is placed on the substrate surface 15 with stencil openings 510 disposed over the IC chips 1. The openings 510 in the stencil should be at least the size of the IC chips 1. Also, the stencil 500 should have a thickness of at least the height of the low-profile gap 140.

After the stencil 500 is positioned over the assembly, a material, such as, for example, a silica field thixotropic epoxy 520 is deposited over the stencil 500. A sufficient amount of epoxy 520 is deposited on the stencil to flow into the openings 510 to a height of, for example, the low-profile gap 140. Capillary action can then be relied upon to draw the epoxy 520 located the openings 510 through the spaces between the interconnect bonds 110 and into the open low-profile gaps 140 of the respective IC chips 1. In a substantially similar manner to the arrangement of FIGS. 4A and 4B, as the epoxy is drawn into the low-profile gap 140 in FIG. 5A, the corresponding displaced air can escape through the aperture 30 instead of forming undesirable air pockets. Likewise, it is possible for the epoxy underfill to extend into the aperture 30 without any corresponding deleterious effects to the assembly. A corresponding completed assembly is shown in FIG. 5B with a resulting underfill 600 and border 610.

Referring back to FIG. 5A, the openings 510 in the stencil 500 should have an open area that defines an outer perimeter for the desired surrounding epoxy border 610 shown in FIG. 5B. For ease of assembly, it is advantageous to employ a stencil 500 having a thickness substantially corresponding to the height of the desired border relative to the substrate surface 15 as is shown in FIG. 5A. In this manner, the amount of epoxy that needs to be deposited does not need to be accurately measured. A sufficient quantity of the epoxy 520 only needs to be deposited to fill the stencil openings 510. However, a larger amount of epoxy 520 can be deposited, such as to cover the stencil 500 as shown in FIG. 5A. Accordingly, a squeegee can be employed to wipe off any excess epoxy 520 extending out of the openings 510. Then, the stencil 500 is removed leaving the epoxy border 610 surrounding the IC chips 1 with a height substantially equal to the thickness of the stencil 500 as shown in FIG. 5B.

Such a method, facilitates the formation of IC chip underfills for relatively large number of assemblies at low cost. However, it is alternatively possible in accordance with the invention, to deposit epoxy in each stencil opening 510 to the desired border height below the thickness of the stencil's thickness. Such a technique can be performed without a subsequent squeegee step.

In either of the epoxy formation techniques of FIGS. 4A and 4B, and 5A and 5B as well as other embodiments, it is possible to subject the component assembly to an environment with a higher pressure above the IC chip 1 relative to a pressure below the substrate surface 225 opposite the major surface 15 to push or draw the epoxy 520 into the low-profile gaps 140 through the apertures 30. In another embodiment, the epoxy can be pumped into the gaps 140 through the apertures 30. The invention provides an additional benefit of enabling coupling of a heat sink to the IC chips I through the apertures 30 to provide heat dissipation in a low profile assembly.

Although several embodiments of the invention have been described in detail above, many modifications can be made without departing from the teaching thereof. All of such modifications are intended to be encompassed within the following claims. For instance, although the invention has been described with respect to bonding IC chips and substrates with different coefficients of thermal expansion and the use of an underfill, it is alternatively possible to employ the aperture of the invention solely for the cleaning of flux residues without the use of an underfill or solely for the addition of an underfill when the solder joints are formed using a flux that leaves little or no residues. An exemplary residue-less solder paste is described in, for example, U.S. Pat. No. 5,211,764, which is assigned to the assignee of the present invention and incorporated by reference herein.

What is claimed is:

1. A method for bonding an integrated circuit chip to a substrate comprising:

providing at least one aperture in a major surface of said substrate;

bonding at least two contact pads of said integrated circuit to matching contact pads on said major substrate surface to form corresponding electrical interconnections wherein said integrated circuit covers an area of the substrate containing said at least one aperture, said bonding step forming a low-profile gap between said integrated circuit and said substrate; and flowing cleaning fluid into said low-profile gap through said aperture for removal of at least a portion of undesirable material from said gap.

2. The method of claim 1 wherein said bonding step forms said low-profile gap with a height of approximately no greater than 150 µm.

3. The method of claim 2 wherein said bonding step forms said low-profile gap with a height of approximately no greater than 100 µm.

4. The method of claim 3 wherein said bonding step forms said low-profile gap with a height of approximately no greater than 50 µm.

5. The method of claim 1 wherein said fluid is a flux residue cleaning fluid.

6. The method of claim 1 wherein said fluid is flowed into said low-profile gap substantially based on the effects of gravity.

7. A method for bonding an integrated circuit chip to a substrate comprising:

providing at least one aperture in a major surface of said substrate;

bonding at least two contact pads of said integrated circuit to matching contact pads on said major substrate surface to from corresponding electrical interconnections wherein said integrated circuit covers an area of the substrate containing said at least one aperture, said bonding step forming a low-profile gap between said integrated circuit and said substrate;

providing containment walls on a major surface opposite said major substrate surface;

disposing cleaning fluid in a cavity formed by said containment walls and said opposite major substrate surface;

and draining said cleaning fluid through said aperture and into said gap for removal of at least a portion of undesirable material from said gap.

8. The method of claim 7 wherein said bonding step forms said low-profile gap with a height of approximately no greater than 150 µm.

9. The method of claim 7 wherein said bonding step forms said low-profile gap with a height of approximately no greater than 100 µm.

10. The method of claim 7 wherein said bonding step forms said low-profile gap with a height of approximately no greater than 50 µm.

11. The method of claim 7 wherein said fluid is a flux residue cleaning fluid.

* * * * *